United States Patent
Huang et al.

(10) Patent No.: US 11,587,953 B2
(45) Date of Patent: Feb. 21, 2023

(54) DRIVE BACKPLANE AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Peng Huang, Beijing (CN); Tao Gao, Beijing (CN); Bingqiang Gui, Beijing (CN); Yucheng Chan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 17/026,503

(22) Filed: Sep. 21, 2020

(65) Prior Publication Data
US 2021/0257392 A1 Aug. 19, 2021

(30) Foreign Application Priority Data
Feb. 18, 2020 (CN) .......................... 202010099955.2

(51) Int. Cl.
*H01L 27/00* (2006.01)
*H01L 29/00* (2006.01)
(Continued)

(52) U.S. Cl.
CPC .......... *H01L 27/1225* (2013.01); *H01L 23/60* (2013.01); *H01L 27/1251* (2013.01);
(Continued)

(58) Field of Classification Search
CPC ..... H01L 23/60; H01L 23/291; H01L 23/552; H01L 27/1225; H01L 27/1251;
(Continued)

(56) References Cited

U.S. PATENT DOCUMENTS 9,147,719 B2 * 9/2015 Kim .................... H01L 27/1225
9,911,762 B2 * 3/2018 Yan .................... H01L 29/78648
(Continued)

FOREIGN PATENT DOCUMENTS

CN 107086227 A 8/2017
CN 109300915 A 2/2019

OTHER PUBLICATIONS

Office Action dated Apr. 14, 2022, issued in counterpart to CN Application No. 202010099955.2, with English Translation. (13 pages).

*Primary Examiner* — Nikolay K Yushin
(74) *Attorney, Agent, or Firm* — WHDA, LLP

(57) ABSTRACT

A drive backplane and a display panel are provided, the drive backplane includes: a substrate; and an oxide thin film transistor arranged on the substrate, wherein the oxide thin film transistor includes: an oxide active layer; a first gate structure disposed on a side of the oxide active layer away from the substrate; and a second gate structure disposed between the oxide active layer and the substrate; wherein at least one of the first gate structure and the second gate structure comprises a plurality of gate electrodes spaced apart along a direction in which the oxide active layer extends.

16 Claims, 8 Drawing Sheets

(51) Int. Cl.
*H01L 27/12* (2006.01)
*H01L 23/60* (2006.01)
*H01L 29/786* (2006.01)
*H01L 27/32* (2006.01)

(52) U.S. Cl.
CPC .... *H01L 29/7869* (2013.01); *H01L 29/78633* (2013.01); *H01L 29/78648* (2013.01); *H01L 29/78675* (2013.01); H01L 27/3262 (2013.01); H01L 27/3272 (2013.01)

(58) Field of Classification Search
CPC ............ H01L 27/3262; H01L 27/3272; H01L 29/78633; H01L 29/78648; H01L 29/78675; H01L 29/7869; H01L 23/645; H01L 23/672; H01L 23/295; H01L 29/78645
See application file for complete search history.

(56) References Cited

U.S. PATENT DOCUMENTS

| | | | |
|---|---|---|---|
| 10,504,984 B2 * | 12/2019 | Gu | H01L 29/42384 |
| 11,158,710 B2 * | 10/2021 | Ishida | G02F 1/13454 |
| 2015/0123084 A1 * | 5/2015 | Kim | H01L 27/326 257/40 |
| 2017/0162606 A1 * | 6/2017 | Yan | H01L 27/1248 |
| 2019/0067399 A1 * | 2/2019 | Ishida | G02F 1/13454 |
| 2019/0280070 A1 * | 9/2019 | Gu | H01L 27/1255 |
| 2021/0280719 A1 * | 9/2021 | Kim | H01L 29/78696 |
| 2022/0013670 A1 * | 1/2022 | Kim | H01L 27/1233 |

\* cited by examiner

DRIVE BACKPLANE AND DISPLAY PANEL

CROSS-REFERENCE TO RELATED APPLICATION

This application claims priority to the Chinese Patent Application No. 202010099955.2 filed with the National Intellectual Property Administration of China on Feb. 18, 2020, which is incorporated herein by reference in its entirety.

TECHNICAL FIELD

The present disclosure relates to a field of display technology, and in particular to a drive backplane and a display panel.

BACKGROUND

As an inevitable development trend of OLED (Organic Light-Emitting Diode) devices, flexible foldable display devices have broad market prospects due to consumers' love.

SUMMARY

Some embodiments of the present disclosure provide a drive backplane, comprising:

a substrate; and an oxide thin film transistor arranged on the substrate, wherein the oxide thin film transistor comprises: an oxide active layer; a first gate structure disposed on a side of the oxide active layer away from the substrate; and a second gate structure disposed between the oxide active layer and the substrate; wherein at least one of the first gate structure and the second gate structure comprises a plurality of gate electrodes spaced apart along a direction in which the oxide active layer extends.

In some embodiments, a gate voltage supplied to each of the plurality of gate electrodes is adjustable.

In some embodiments, gate voltages supplied to the plurality of gate electrodes are the same or different.

In some embodiments, for any one of the first gate structure and the second gate structure, a distance between two adjacent gate electrodes along the direction in which the oxide active layer extends is less than or equal to 2 µm.

In some embodiments, for any one of the first gate structure and the second gate structure, distances between the plurality of gate electrodes and the oxide active layer are the same.

In some embodiments, for any one of the first gate structure and the second gate structure, distances between at least two gate electrodes of the plurality of gate electrodes and the oxide active layer are different.

In some embodiments, the first gate structure comprises a first gate electrode and a second gate electrode, and orthographic projections of the first gate electrode and the second gate electrode on the substrate fall within an orthographic projection of the second gate structure on the substrate.

In some embodiments, the second gate structure comprises a third gate electrode and a fourth gate electrode, and orthographic projections of the third gate electrode and the fourth gate electrode on the substrate fall within an orthographic projection of the first gate structure on the substrate.

In some embodiments, the first gate structure comprises a first gate electrode and a second gate electrode, the second gate structure comprises a third gate electrode and a fourth gate electrode, an orthographic projection of the first gate electrode on the substrate at least partially overlaps an orthographic projection of the third gate electrode on the substrate, and an orthographic projection of the second gate electrode on the substrate at least partially overlaps an orthographic projection of the fourth gate electrode on the substrate.

In some embodiments, the oxide thin film transistor further comprises a charge shielding layer disposed between the oxide active layer and the substrate, and a distance between the charge shielding layer and the oxide active layer is greater than or equal to a distance between the second gate structure and the oxide active layer.

In some embodiments, the charge shielding layer is supplied with a first voltage, and the first voltage is less than a gate voltage supplied to each of the plurality of gate electrodes.

In some embodiments, the charge shielding layer is disposed between the second gate structure and the substrate, and an orthographic projection of the charge shielding layer at least partially overlaps an orthographic projection of the second gate structure on the substrate.

In some embodiments, the charge shielding layer and the second gate structure are located in the same layer, and an orthographic projection of the charge shielding layer on the substrate does not overlap an orthographic projection of the second gate structure on the substrate.

In some embodiments, the oxide thin film transistor further comprises a light blocking layer disposed between the oxide active layer and the substrate, and a distance between the light blocking layer and the oxide active layer is greater than or equal to a distance between the second gate structure and the oxide active layer.

In some embodiments, the light blocking layer is disposed between the second gate structure and the substrate, and an orthographic projection of the light blocking layer on the substrate at least partially overlaps an orthographic projection of the second gate structure on the substrate.

In some embodiments, the light blocking layer and the second gate structure are located in the same layer, and an orthographic projection of the light blocking layer on the substrate does not overlap an orthographic projection of the second gate structure on the substrate.

In some embodiments, the drive backplane further comprising: a low temperature poly-silicon thin film transistor arranged on the substrate, wherein the low temperature poly-silicon thin film transistor comprises: a poly-silicon active layer; and a third gate structure disposed on a side of the poly-silicon active layer away from the substrate.

In some embodiments, the third gate structure and the second gate structure are located in the same layer.

Some embodiments of the present disclosure provide a display panel, comprising the drive backplane according to the above embodiments.

BRIEF DESCRIPTION OF THE DRAWINGS

The accompanying drawings herein are incorporated into the specification and constitute a part of the specification, show embodiments in accordance with the present disclosure, and are used together with the specification to explain the principle of the present disclosure.

DETAILED DESCRIPTION OF EMBODIMENTS

Figure 1:
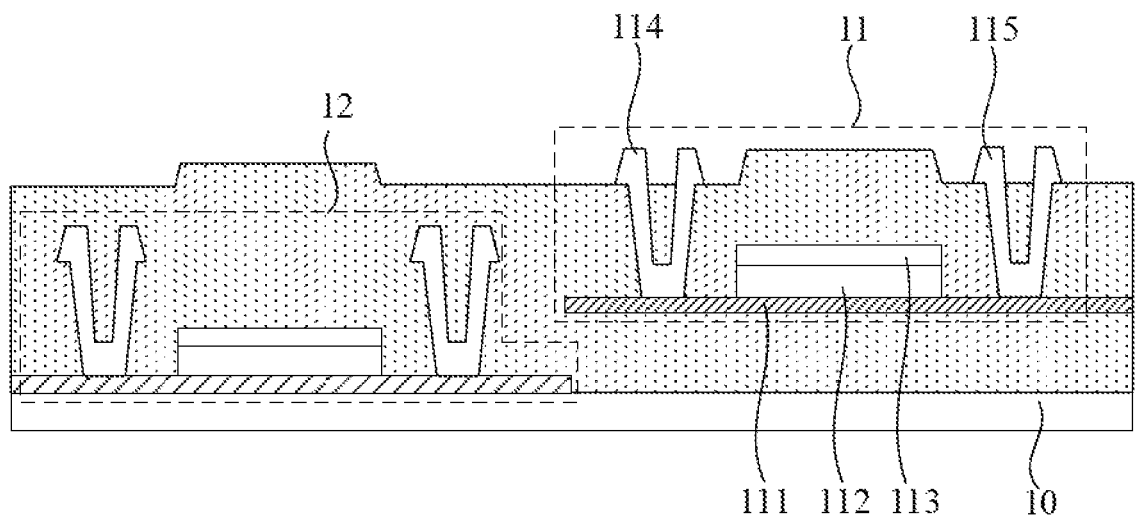
FIG. 1 is a schematic structural diagram of a drive backplane according to the related art.

Here, exemplary embodiments will be described in detail, and examples thereof are shown in the accompanying drawings. When the following description refers to the drawings, unless otherwise indicated, the same reference numerals in different drawings indicate the same or similar elements. The implementations described in the following exemplary embodiments do not represent all implementations consistent with the present disclosure. Rather, they are merely examples of devices and methods consistent with some aspects of the present disclosure as detailed in the appended claims.

In the related art, Poly-Si (poly-silicon) made by the LTPS (Low Temperature Poly-Silicon) process is used in the drive backplane of the OLED as the thin film transistor semiconductor layer, that is, the active layer. However, since the leakage current of the Poly-Si thin film transistor is relatively large, the power consumption of the display device will inevitably increase. An oxide thin film transistor with oxide such as IGZO (indium gallium zinc oxide) or ZnO (zinc oxide) as the active layer is used to replace part of the poly-silicon thin film transistors of the OLED display device with Poly-Si as the active layer. For example, a poly-silicon thin film transistor with Poly-Si as the active layer may be used as a switching thin film transistor of the OLED display device, and an oxide thin film transistor with oxide such as IGZO or ZnO as the active layer may be used as a drive thin film transistor of the OLED display device. This technology is referred to as LTPO (Low Temperature Polycrystalline Oxide) technology, which uses the advantage of low leakage current of oxide thin film transistor to reduce the possibility of leakage of the display device during display.

However, the difficulty of LTPO technology lies in the poor heat resistance of oxide thin film transistor (TFT) devices prepared by oxide. During high-temperature manufacturing processes, some points of the device are prone to oxygen escape and cause device failure, which leads to display failure of the display device. Some oxide thin film transistors cause serious shift of device characteristics due to oxygen escape (or hydrogen diffusion) in Oxide, resulting in deterioration of the uniformity and stability of the threshold voltage Vth of the oxide thin film transistor.

FIG. 1 is a schematic structural diagram of a drive backplane according to the related art. As shown in FIG. 1, the drive backplane includes a substrate 10, and an oxide thin film transistor 11 and a poly-silicon thin film transistor 12 arranged on the substrate 10. The oxide thin film transistor 11 includes an oxide active layer 111 on the substrate 10, and a gate electrode 113, a source electrode 114 and a drain electrode 115 disposed on a side of the oxide active layer 111 away from the substrate 10, wherein a gate insulating layer 112 is provided between the gate electrode 113 and the oxide active layer 111, the source electrode 114 and the drain electrode 115 are respectively located on both sides of the gate electrode 113 and are electrically connected to the oxide active layer 111. Those skilled in the art can understand that the connection part of the oxide active layer 111 with the source electrode 114 and the drain electrode 115 is conductive. The gate electrode 113 of the oxide thin film transistor 11 shown in FIG. 1 is an integral structure, and the above-mentioned problems cannot be avoided.

To solve the above-mentioned technical problems, the present disclosure provides a drive backplane, including: a substrate; and an oxide thin film transistor arranged on the substrate, wherein the oxide thin film transistor includes: an oxide active layer; a first gate structure disposed on a side of the oxide active layer away from the substrate; and a second gate structure disposed between the oxide active layer and the substrate, wherein at least one of the first gate electrode and the second gate electrode includes a plurality of gate electrodes spaced apart along a direction in which the oxide active layer extends. The drive backplane may improve the uniformity and stability of the oxide thin film transistor.

Figure 2:
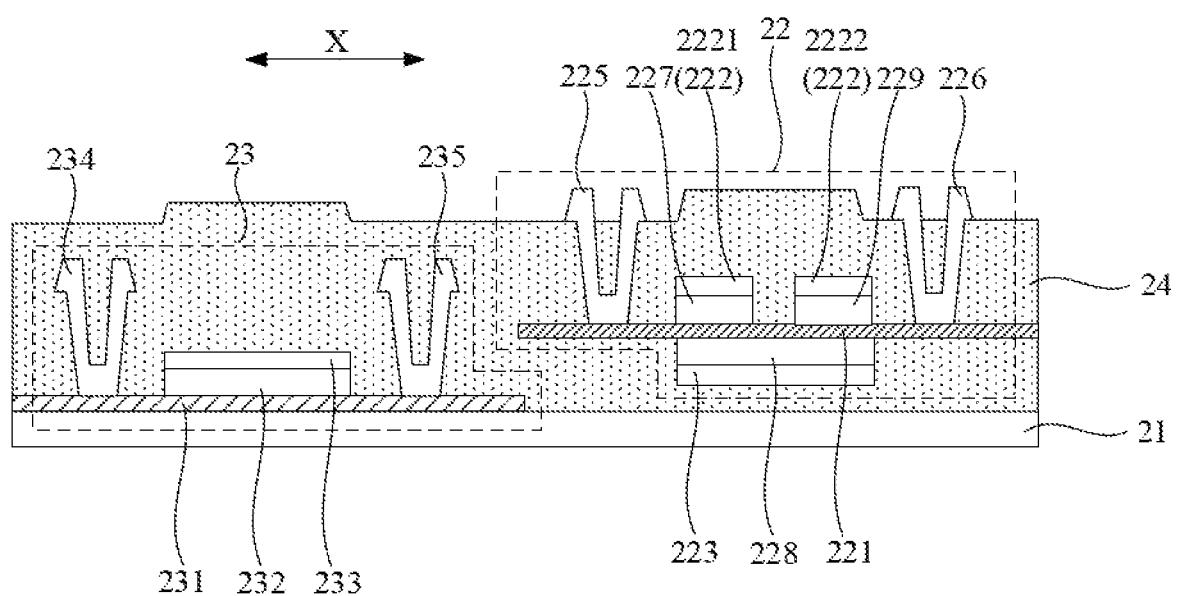
FIG. 2 is a schematic structural diagram of a drive backplane according to some embodiments of the present disclosure.

Some embodiments of the present disclosure provide a drive backplane. FIG. 2 is a schematic structural diagram of a drive backplane according to some embodiments of the present disclosure. As shown in FIG. 2, the drive backplane includes: a substrate 21, an oxide thin film transistor 22, and a poly-silicon thin film transistor 23. The poly-silicon thin film transistor 23 is, for example, a low temperature poly-silicon thin film transistor.

As shown in FIG. 2, the oxide thin film transistor 22 and the low temperature poly-silicon thin film transistor 23 are disposed on the substrate 21, and the oxide thin film transistor 22 is farther away from the substrate 21 than the low temperature poly-silicon thin film transistor 23. The oxide thin film transistor 22 includes an oxide active layer 221, a first gate structure 222 and a second gate structure 223. The first gate structure 222 is disposed on a side of the oxide active layer 221 away from the substrate 21, and the second gate structure 223 is disposed between the oxide active layer 221 and the substrate 21. At least one of the first gate structure 222 and the second gate structure 222 includes a plurality of gate electrodes spaced apart along a direction X in which the oxide active layer 221 extends. For example, as shown in FIG. 2, the first gate structure 222 includes a first gate electrode 2221 and a second gate electrode 2222 spaced apart along the direction X in which the active oxide layer 221 extends. The second gate structure 223 is a single gate electrode, also called a gate electrode 223. It can be considered that the oxide thin film transistor 22 includes at least three gate electrodes. For example, the at least three gate electrodes include the first gate electrode 2221, the second gate electrode 2222, and the gate electrode 223.

In these embodiments, since the oxide thin film transistor includes at least three gate electrodes, a gate voltage supplied to each of the gate electrodes is adjustable. The gate voltage mentioned herein refers to, for each of the gate electrodes, a high-level voltage Vgl of a gate electrode signal supplied to the gate electrode. In this way, when the oxide thin film transistor is in operation, the gate voltages supplied to the at least three gate electrodes can be adjusted separately, so that the uniformity of the oxide thin film transistor can be improved. Since the gate electrodes are provided on both sides of the oxide active layer, and at least two gate electrodes are disposed on the oxide active layer, then at least two of the at least three gate electrodes are located on the same side of the oxide active layer. In this way, the uniformity of the threshold voltage of the oxide thin film transistor can be enhanced by the differentiation effect, and the reliability and stability between the different gate electrodes of the oxide thin film transistor can be improved by the synergistic effect, thereby improving the stability of the oxide thin film transistor. In summary, the technical schemes provided by some embodiments of the present disclosure can improve the uniformity and stability of the oxide thin film transistor.

The drive backplane in the embodiments of the present disclosure has been briefly introduced above, and the drive backplane will be described in detail below.

Some embodiments of the present disclosure provide a drive backplane. As shown in FIG. 2, the drive backplane includes: a substrate 21, an oxide thin film transistor 22, a low temperature poly-silicon thin film transistor 23, and a passivation protective layer 24.

As shown in FIG. 2, the low temperature poly-silicon thin film transistor 23 is disposed on the substrate 21. The low temperature poly-silicon thin film transistor 23 includes a poly-silicon active layer 231, a gate insulating layer 232, a third gate structure 233, a source electrode 234 and a drain electrode 235. A material of the poly-silicon active layer 231 is low temperature poly-silicon. The gate insulating layer 232 is disposed on the side of the poly-silicon active layer 231 away from the substrate 21. The third gate structure 233 is disposed on the side of the gate insulating layer 232 away from the substrate 21. The source electrode 234 and the drain electrode 235 are disposed on the side of the poly-silicon active layer 231 away from the substrate 21 and respectively on both sides of the poly-silicon active layer 231. As shown in FIG. 2, the gate insulating layer 232 and the third gate structure 233 are both located between the source electrode 234 and the drain electrode 235. In some embodiments, the third gate structure 233 and the second gate structure 223 are located in the same layer, that is, the third gate structure 233 and the second gate structure 223 are formed of the same material by using the same patterning process.

As shown in FIG. 2, the oxide thin film transistor 22 is farther away from the substrate 21 than the low temperature poly-silicon thin film transistor 23. The oxide thin film transistor 22 and the low temperature poly-silicon thin film transistor 23 are insulated from each other, and an interlayer insulating layer may be provided therebetween. The material of the interlayer insulating layer may be an organic material or an inorganic material. The organic material includes at least one of silicone resin or acrylic resin. The inorganic material may include at least one of silicon oxide and silicon nitride, but is not limited thereto.

As shown in FIG. 2, the oxide thin film transistor 22 includes the oxide active layer 221, the first gate electrode 2221, the second gate electrode 2222, and the gate electrode 223. The first gate electrode 2221 and the second gate electrode 2222 are located on the side of the oxide active layer 221 away from the substrate 21, and the gate electrode 223 is located on the side of the oxide active layer 221 close to the substrate 21. The material of the oxide active layer 221 may be IGZO or ZnO, but is not limited thereto. There is a gap between the first gate electrode 2221 and the second gate electrode 2222, and the gap is less than or equal to 2 μm. An orthographic projection of the first gate electrode 2221 on the substrate 21 and that of the second gate electrode 2221 on the substrate 21 fall within an orthographic projection of the gate electrode 223 on the substrate 21.

As shown in FIG. 2, the oxide thin film transistor 22 further includes a source electrode 225, a drain electrode 226, a gate insulating layer 227, a gate insulating layer 228, and a gate insulating layer 229. The gate insulating layer 227 is located between the first gate electrode 2221 and the oxide active layer 221. The gate insulating layer 228 is located between the gate electrode 223 and the oxide active layer 221. The gate insulating layer 229 is located between the second gate electrode 2222 and the oxide active layer 221. The source electrode 225 and the drain electrode 226 are located on the side of the oxide active layer 221 away from the substrate 21. The first gate electrode 2221, the second gate electrode 2222, the gate insulating layer 227, and the gate insulating layer 229 are located between the source electrode 225 and the drain electrode 226.

In these embodiments, since the oxide thin film transistor includes three gate electrodes, the gate voltages supplied to the three gate electrodes can be adjusted separately to make the adjustment finer when the oxide thin film transistor is in operation. In this way, the uniformity of the oxide thin film transistor can be improved.

In these embodiments, the first gate electrode 2221 and the second gate electrode 2222 are located on the side of the oxide active layer 221 away from the substrate 21, and the first gate electrode 2221 and the second gate electrode 2222 are top gate electrodes. The gate electrode 223 is located on the side of the oxide active layer 221 close to the substrate 21, and the gate electrode 223 is the bottom gate electrode. In this way, the structure where the top gate electrode and bottom gate electrode coexist can improve the stability of the device and avoid threshold voltage shift (Vth Shift) caused by movements of movable charges.

In these embodiments, the gate voltages supplied to the first gate electrode 2221, the second gate electrode 2222 and the gate electrode 223 are adjustable. The gate voltages supplied to the three can be the same or different. The first gate electrode 2221, the second gate electrode 2222 and the gate electrode 223 are separated from each other. The adjustments of the gate voltages on the first gate electrode 2221, the second gate electrode 2222 and the gate electrode 223 can be synchronized. The gate voltages supplied to the three gate electrodes are adjusted separately to make the gate voltage adjustment finer, which can improve the uniformity of the oxide thin film transistor.

In these embodiments, the first gate electrode 2221 and the second gate electrode 2222 are located in the same layer, and the two constitute the first gate structure 222. "Located in the same layer" mentioned in the present disclosure refers to being formed of the same material by using the same patterning process. For example, the first gate electrode 2221 and the second gate electrode 2222 are formed of the same material by using the same patterning process. Furthermore, as shown in FIG. 2, the distance between the first gate electrode 2221 and the oxide active layer 221 is equal to the distance between the second gate electrode 2222 and the oxide active layer 221, that is, the first gate electrode 2221 and the second gate electrode 2222 are substantially in the same plane. In this way, the uniformity of the threshold voltage of the oxide thin film transistor can be enhanced by the differentiation effect, and the reliability and stability between the different gate electrodes of the oxide thin film transistor can be improved by the synergistic effect, thereby improving the stability of the oxide thin film transistor. The oxide thin film transistor 22 in these embodiments may be applied to a pixel circuit, which can also greatly reduce the rising edge and falling edge time during signal transmission, increase the response speed, and improve the problem of afterimages.

In some embodiments, the first gate electrode 2221, the second gate electrode 2222 and the gate electrode 223 are respectively connected to different signal lines. In this way, the voltage adjustments of the first gate electrode 2221, the second gate electrode 2222 and the gate electrode 223 are independent of each other, and the voltages supplied to the three gate electrodes can be adjusted separately. In this way, the uniformity of the oxide thin film transistor can be improved.

In these embodiments, since the oxide thin film transistor includes at least three gate electrodes, the gate voltages supplied to the at least three gate electrodes can be adjusted separately when the oxide thin film transistor is in operation. In this way, the uniformity of the oxide thin film transistor can be improved. Since the oxide active layer is provided with gate electrodes on both the side away from the substrate and the side close to the substrate, at least two of the at least three gate electrodes are located on the same side of the oxide active layer. In this way, the uniformity of the threshold voltage of the oxide thin film transistor can be enhanced by the differentiation effect, and the reliability and stability between the different gate electrodes of the oxide thin film transistor can be improved by the synergistic effect, thereby improving the stability of the oxide thin film transistor. In summary, the technical schemes provided by some embodiments of the present disclosure can improve the uniformity and stability of the oxide thin film transistor.

Figure 3:
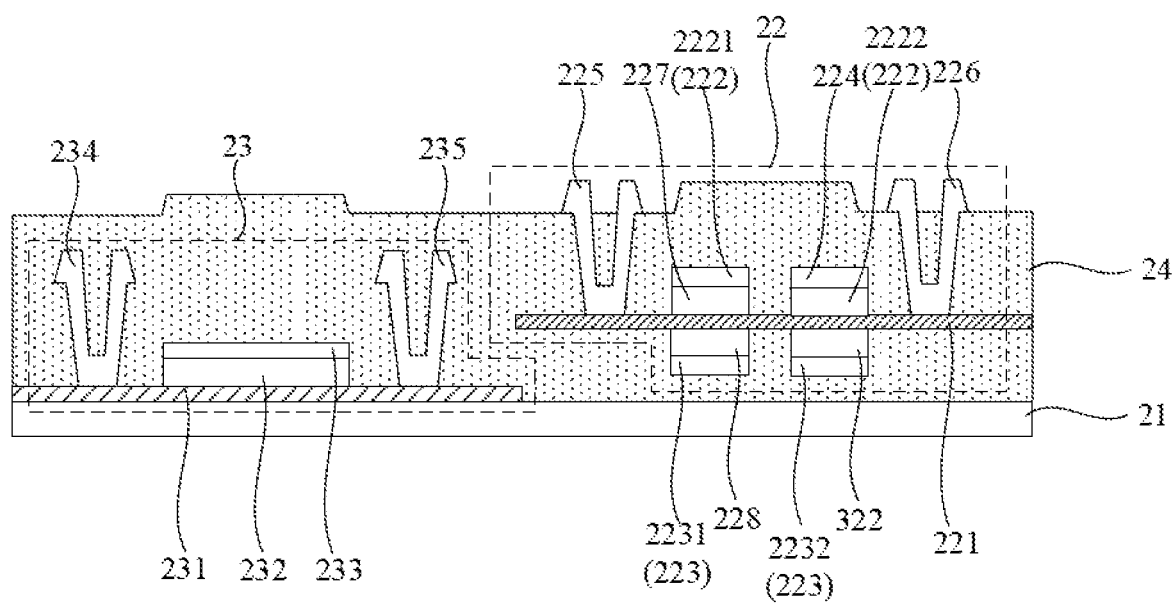
FIG. 3 is a schematic structural diagram of a drive backplane according to some embodiments of the present disclosure.

Some embodiments of the present disclosure provide a drive backplane. FIG. 3 is a schematic structural diagram of another drive backplane according to some embodiments of the present disclosure. As shown in FIG. 3, these embodiments differ from the embodiments shown in FIG. 2 in that the oxide thin film transistor 22 includes the first gate electrode 2221, the second gate electrode 2222, a third gate electrode 2231, a fourth gate electrode 2232, the gate insulating layer 227, the gate insulating layer 228, the gate insulating layer 229, and a gate insulating layer 322. The first gate electrode 2221 and the second gate electrode 2222 are located on the side of the oxide active layer 221 away from the substrate 21 and constitute the first gate structure 222. The third gate electrode 2231 and the fourth gate electrode 2232 are located on the side of the oxide active layer close to the substrate 21 and constitute the second gate structure 223. That is, each of the first gate structure 222 and the second gate structure 223 includes a plurality of gate electrodes, for example, two gate electrodes.

In this embodiment, the orthographic projection of the first gate electrode 2221 on the substrate 21 at least partially overlaps that of the orthographic projection of the third gate electrode 2231 on the substrate 21. For example, as shown in FIG. 3, the orthographic projection of the first gate electrode 2221 on the substrate 21 substantially coincides with that of the third gate electrode 2231 on the substrate 21. The orthographic projection of the second gate electrode 2222 on the substrate 21 at least partially overlaps that of the fourth gate electrode 2232 on the substrate 21. For example, as shown in FIG. 3, the orthographic projection of the second gate electrode 2222 on the substrate 21 substantially coincides with that of the fourth gate electrode 2232 on the substrate 21.

As shown in FIG. 3, the gate insulating layer 227 is located between the first gate electrode 2221 and the oxide active layer 221, the gate insulating layer 228 is located between the gate electrode 2231 and the oxide active layer 221, the gate insulating layer 229 is located between the second gate electrode 2222 and the oxide active layer 221, and the gate insulating layer 322 is located between the fourth gate electrode 2232 and the oxide active layer 221.

In these embodiments, the first gate electrode 2221 and the second gate electrode 2222 are top gate electrodes, and the third gate electrode 2231 and the fourth gate electrode 2232 are bottom gate electrodes.

In these embodiments, since the oxide thin film transistor includes four gate electrodes, the voltages supplied to the four gate electrodes can be adjusted separately to make the adjustment finer when the oxide thin film transistor is in operation, which can improve the uniformity of the oxide thin film transistor.

In this embodiment, there is a gap between the first gate electrode 2221 and the second gate electrode 2222, and the gap is less than or equal to 2 μm. The first gate electrode 2221 and the second gate electrode 2222 are located in the same layer, and the two constitute the first gate structure 222. Specifically, the first gate electrode 2221 and the second gate electrode 2222 are formed of the same material by using the same patterning process. Furthermore, as shown in FIG. 3, the distance between the first gate electrode 2221 and the oxide active layer 221 is equal to the distance between the second gate electrode 2222 and the oxide active layer 221, that is, the first gate electrode 2221 and the second gate electrode 2222 are substantially in the same plane. There is a gap between the third gate electrode 2231 and the fourth gate electrode 2232, and the gap is less than or equal to 2 μm. The third gate electrode 2231 and the fourth gate electrode 2232 are located in the same layer, and the two constitute the second gate structure 223. Specifically, the third gate electrode 2231 and the fourth gate electrode 2232 are formed of the same material by using the same patterning process. Furthermore, as shown in FIG. 3, the distance between the third gate electrode 2231 and the oxide active layer is equal to the distance between the fourth gate electrode 2232 and the oxide active layer 221. That is to say, the third gate electrode 2231 and the fourth gate electrode 2232 are substantially in the same plane. In this way, the uniformity of the threshold voltage of the oxide thin film transistor can be enhanced by the differentiation effect, and the reliability and stability between the different gate electrodes of the oxide thin film transistor can be improved by the synergistic effect, thereby improving the stability of the oxide thin film transistor. The oxide thin film transistor in these embodiments may be applied to a pixel circuit, which can also greatly reduce the rising edge and falling edge time during signal transmission, increase the response speed, and improve the problem of afterimages.

Figure 4:
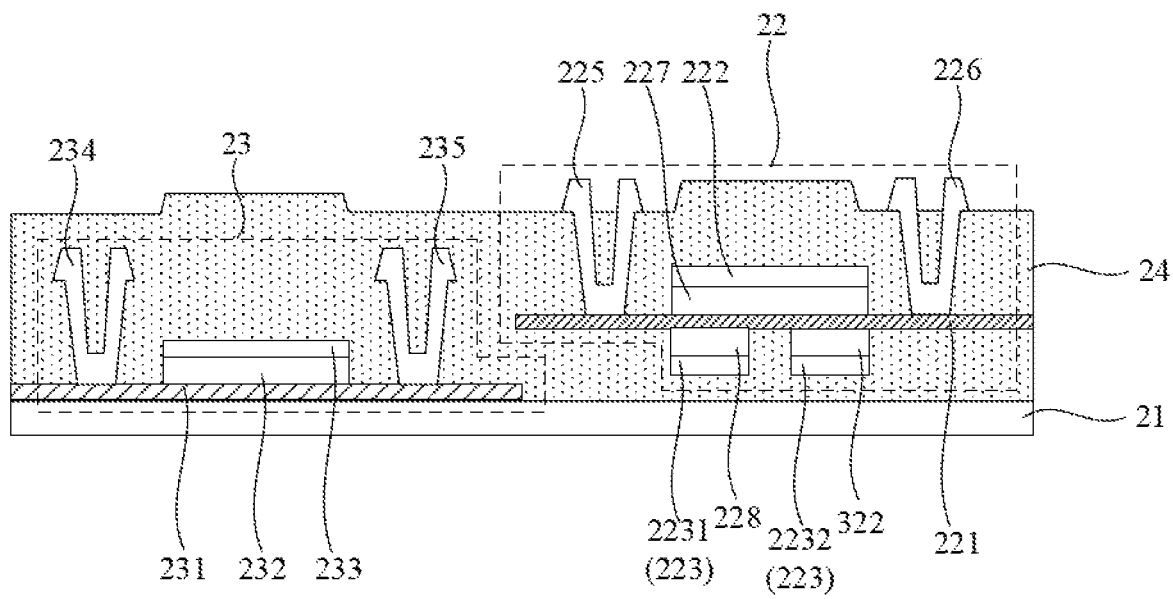
FIG. 4 is a schematic structural diagram of a drive backplane according to some embodiments of the present disclosure.

Some embodiments of the present disclosure provide a drive backplane. FIG. 4 is a schematic structural diagram of a drive backplane according to some embodiments of the present disclosure; As shown in FIG. 4, these embodiments differ from the embodiments shown in FIG. 2 in that the oxide thin film transistor 22 includes the first gate structure 222, the third gate electrode 2231, the fourth gate electrode 2232, the gate insulating layer 227, the gate insulating layer 228, and the gate insulating layer 322. The first gate structure 222 is a single gate electrode, also referred to as a gate electrode 222. The gate electrode 222 is located on the side of the oxide active layer 221 away from the substrate 21. The third gate electrode 2231 and the fourth gate electrode 2232 are located on the side of the oxide active layer close to the substrate 21. The orthographic projection of the third gate electrode 2231 on the substrate 21 and that of the fourth gate electrode 2232 on the substrate 21 fall within the orthographic projection of the gate electrode 222 on the substrate 21.

As shown in FIG. 4, the gate insulating layer 227 is located between the gate electrode 222 and the oxide active layer 221, the gate insulating layer 228 is located between the gate electrode 2231 and the oxide active layer 221, and the gate insulating layer 322 is located between the fourth gate electrode 2232 and the oxide active layer 221.

In these embodiments, the gate electrode 2221 is the top gate electrode, and the third gate electrode 2231 and the fourth gate electrode 2232 are the bottom gate electrodes.

In these embodiments, since the oxide thin film transistor includes three gate electrodes, the gate voltages supplied to the three gate electrodes can be adjusted separately to make the adjustment finer when the oxide thin film transistor is in operation. In this way, the uniformity of the oxide thin film transistor can be improved.

In these embodiments, there is a gap between the third gate electrode 2231 and the fourth gate electrode 2232, and the gap is less than or equal to 2 μm. The third gate electrode 2231 and the fourth gate electrode 2232 are located in the same layer, and the two constitute the second gate structure 223. Specifically, the third gate electrode 2231 and the fourth gate electrode 2232 are formed of the same material by using the same patterning process. Furthermore, as shown in FIG. 4, the distance between the third gate electrode 2231 and the oxide active layer is equal to the distance between the fourth gate electrode 2232 and the oxide active layer 221. That is to say, the third gate electrode 2231 and the fourth gate electrode 2232 are substantially in the same plane. In this way, the uniformity of the threshold voltage of the oxide thin film transistor can be enhanced by the differentiation effect, and the reliability and stability between the different gate electrodes of the oxide thin film transistor can be improved by the synergistic effect, thereby improving the stability of the oxide thin film transistor. The oxide thin film transistor in this embodiments may be applied to a pixel circuit, which can also greatly reduce the rising edge and falling edge time during signal transmission, increase the response speed, and improve the problem of afterimages.

Figure 5:
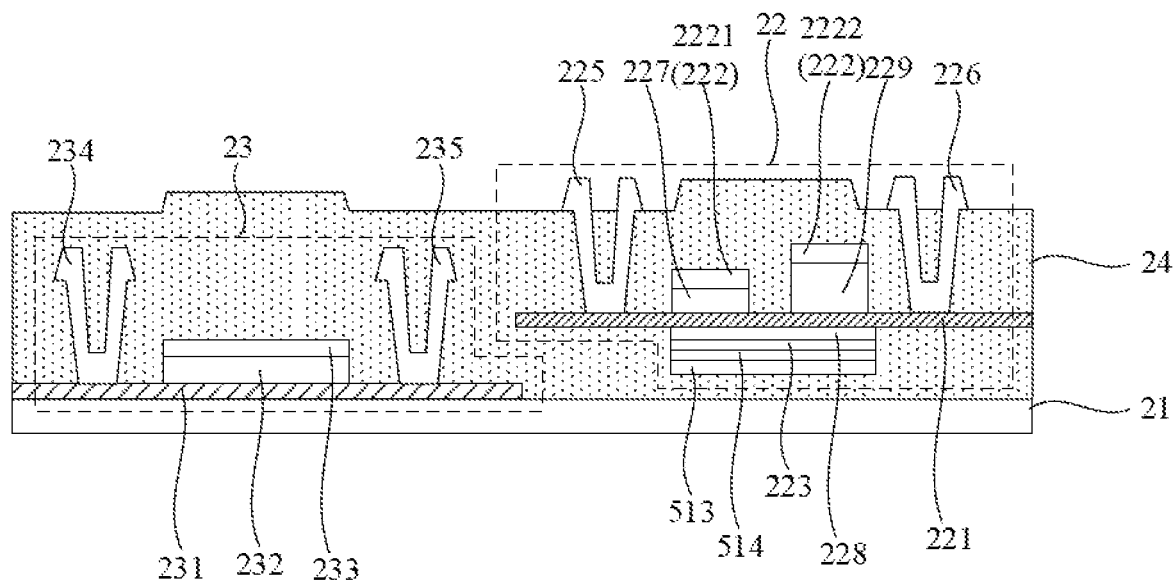
FIG. 5 is a schematic structural diagram of a drive backplane according to some embodiments of the present disclosure.

Some embodiments of the present disclosure provide a drive backplane. FIG. 5 is a schematic structural diagram of a drive backplane according to some embodiments of the present disclosure. As shown in FIG. 5, these embodiments differ from the embodiments shown in FIG. 2 in that the second gate electrode 2222 and the first gate electrode 2221 are located in different planes, that is to say, the distance between the second gate electrode 2222 and the oxide active layer 221 is different from that between the first gate electrode 2221 and the oxide active layer 221. As shown in FIG. 5, the distance between the second gate electrode 2222 and the oxide active layer 221 is greater than that between the first gate electrode 2221 and the oxide active layer 221, that is to say, the second gate electrode 2222 is farther away from the oxide active layer 221 than the first gate electrode 2221. Those skilled in the art can understand that the conduction effect of the gate electrode supplied with the gate voltage on the oxide active layer 221 is affected by the distance between the gate electrode and the oxide active layer 221. In these embodiments, since the oxide thin film transistor includes three gate electrodes, the gate voltages supplied to the three gate electrodes can be adjusted separately to make the adjustment finer when the oxide thin film transistor is in operation. In this way, the uniformity of the oxide thin film transistor can be improved.

As shown in FIG. 5, in some embodiments, the oxide thin film transistor 22 further includes a charge shielding layer 513 and an insulating layer 514, and the charge shielding layer 513 is disposed between the oxide active layer 221 and the substrate 21. Specifically, as shown in FIG. 5, the insulating layer 514 is located on the side of the gate electrode 223 close to the substrate 21, and the charge shielding layer 513 is located on the side of the insulating layer 514 close to the substrate 21. In other words, the charge shielding layer 513 is farther away from the oxide active layer 221 than the gate electrode 223.

In these embodiments, the orthographic projection of the charge shielding layer 513 on the substrate 21 at least partially overlaps that of the gate electrode 223 on the substrate 21. For example, the orthographic projection of the gate electrode 223 on the substrate 21 falls within that of the charge shielding layer 513 on the substrate 21, or the orthographic projection of the charge shielding layer 513 on the substrate 21 coincides with that of the gate electrode 223 on the substrate 21.

When the oxide thin film transistor 22 is in operation, a small positive voltage may be supplied to the charge shielding layer 513, so that the charge shielding layer 513 may attract movable negative charges (such as deep-level O (oxygen)) in the back channel of the oxide active layer 221 and the inorganic film layer close to the substrate. In this way, under the shielding effect of the charge shielding layer, the stability of the oxide thin film transistor can be significantly improved. The small positive voltage supplied to the charge shielding layer 513 is significantly smaller than the gate voltage supplied to any one of the plurality of gate electrodes. The small positive voltage may be close to 0V, for example, 0.1~0.5V.

In some embodiments, the second gate electrode 2222 shown in FIG. 5 can also be used as the charge shielding layer, which is not supplied with the gate voltage but with a shielding voltage. At this time, it can be called a charge shielding layer 2222. In this case, the charge shielding layer 2222 is supplied with a small negative voltage, so that the charge shielding layer 2222 can attract movable positive charges (such as shallow-level H (hydrogen)) above the first gate electrode 2221 and in the source electrode 225 and drain electrode 226, which avoids the threshold shift of the oxide thin film transistor 22 caused by the movement of the movable positive charges to the oxide active layer 221. In this way, under the shielding effect of the charge shielding layer, the stability of the oxide thin film transistor can be significantly improved. The small negative voltage supplied to the charge shielding layer 2222 is significantly smaller than the gate voltage supplied to any one of the plurality of gate electrodes. The small negative voltage may be close to 0V, for example, −0.1~−0.5V.

In some embodiments, the charge shielding layer 513 can be made of an opaque metal material. In this case, the charge shielding layer 513 can be used as a light blocking layer to prevent external light from damaging the stability of the oxide active layer, which can improve the stability of the oxide thin film transistor. In some embodiments, the second gate electrode 2222 can also be made of an opaque metal material. In this case, the second gate electrode 2222 can also be used as a light blocking layer to prevent external light from damaging the stability of the oxide active layer, which can improve the stability of the oxide thin film transistor.

When the charge shielding layer 513 and/or the second gate electrode 2222 are used as a light blocking layer, they may not be supplied with a voltage signal.

Figure 6:
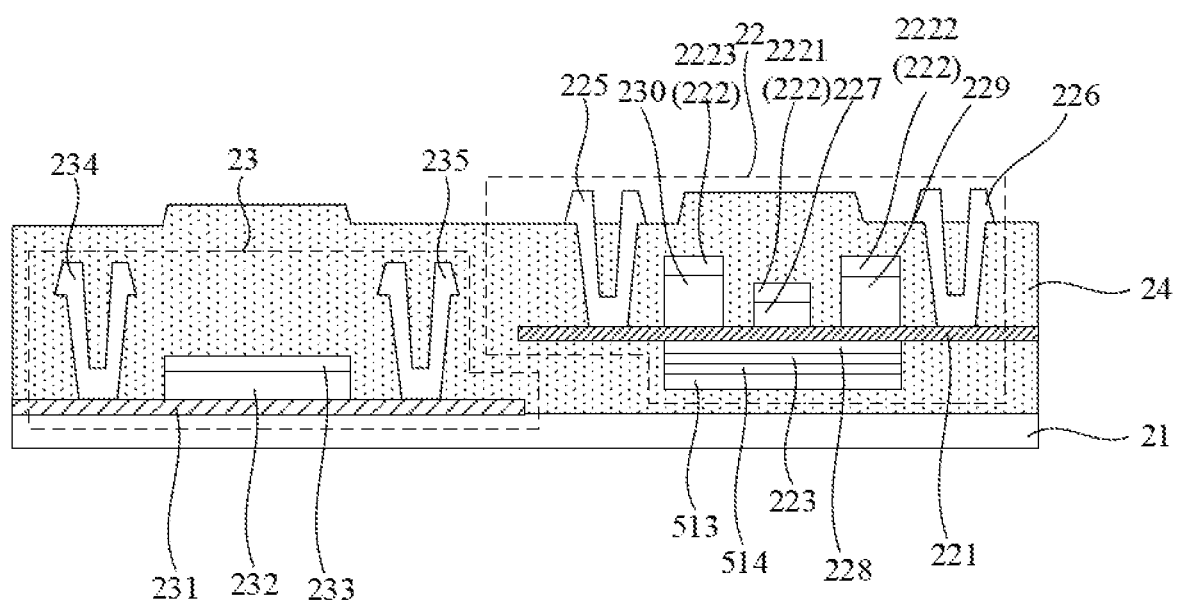
FIG. 6 is a schematic structural diagram of a drive backplane according to some embodiments of the present disclosure.

Some embodiments of the present disclosure provide a drive backplane. FIG. 6 is a schematic structural diagram of a drive backplane according to some embodiments of the present disclosure. As shown in FIG. 6, these embodiments differ from the embodiments shown in FIG. 5 in that the first gate structure 222 includes three gate electrodes, that is, the first gate electrode 2221, the second gate electrode 2222 and a fifth gate electrode 2223. The first gate electrode 2221 is located between the second gate electrode 2222 and the fifth gate electrode 2223. A gate insulating layer 230 is provided between the fifth gate electrode 2223 and the oxide active layer 221. Along the direction in which the oxide active layer 221 extends, there is a gap between the first gate electrode 2221 and the second gate electrode 2222, and there is a gap between the first gate electrode 2221 and the fifth gate electrode 2223. Either gap is less than or equal to 2 μm.

The second gate electrode 2222 and the fifth gate electrode 2223 are located in the same plane, and they are not located in the same plane with the first gate electrode 2221. In other words, the distance between the second gate electrode 2222 and the oxide active layer 221 is equal to the distance between the fifth gate electrode 2223 and the oxide active layer 221, and both of them are different from the distance between the first gate electrode 2221 and the oxide active layer 221. As shown in FIG. 6, the second gate electrode 2222 and the fifth gate electrode 2223 are farther away from the oxide active layer 221 than the first gate electrode 2221. Those skilled in the art can understand that, in other embodiments, any two of the first gate electrode 2221, the second gate electrode 2222 and the fifth gate electrode 2223 are not located in the same plane.

As shown in FIG. 6, the orthographic projections of the first gate electrode 2221, the second gate electrode 2222 and the fifth gate electrode 2223 on the substrate 21 fall within the orthographic projection of the gate electrode 223 on the substrate 21.

In some embodiments, the second gate electrode 2222 and the fifth gate electrode 2223 shown in FIG. 6 can also be used as charge shielding layers, which are not supplied with gate voltages but with shielding voltages. At this time, they can be called a charge shielding layer 2222 and a charge shielding layer 2223. In this case, the charge shielding layer 2222 and the charge shielding 2223 are supplied with a small negative voltage, so that the charge shielding layer 2222 and the charge shielding 2223 can attract movable positive charges (such as shallow-level H (hydrogen)) above the first gate electrode 2221 and in the source electrode 225 and drain electrode 226, which avoids the threshold shift of the oxide thin film transistor 22 caused by the movements of the movable positive charges to the oxide active layer 221. In this way, under the shielding effect of the charge shielding layers, the stability of the oxide thin film transistor can be significantly improved. The small negative voltage supplied to the charge shielding layer 2222 and the charge shielding layer 2223 is significantly smaller than the gate voltage supplied to any one of the plurality of gate electrodes. The small negative voltage may be close to 0V, for example, −0.1~−0.5V.

In some embodiments, the charge shielding layer 513 can be made of an opaque metal material. In this case, the charge shielding layer 513 can be used as a light blocking layer to prevent external light from damaging the stability of the oxide active layer, which can improve the stability of the oxide thin film transistor. In some embodiments, the second gate electrode 2222 and the fifth gate electrode 2223 can also be made of an opaque metal material. In this case, the second gate electrode 2222 and the fifth gate electrode 2223 can also be used as light blocking layers to prevent external light from damaging the stability of the oxide active layer, which can improve the stability of the oxide thin film transistor.

When the charge shielding layer 513, the second gate electrode 2222 and/or the fifth gate electrode 2223 are used as light blocking layers, they may not be supplied with voltage signals.

Figure 7:
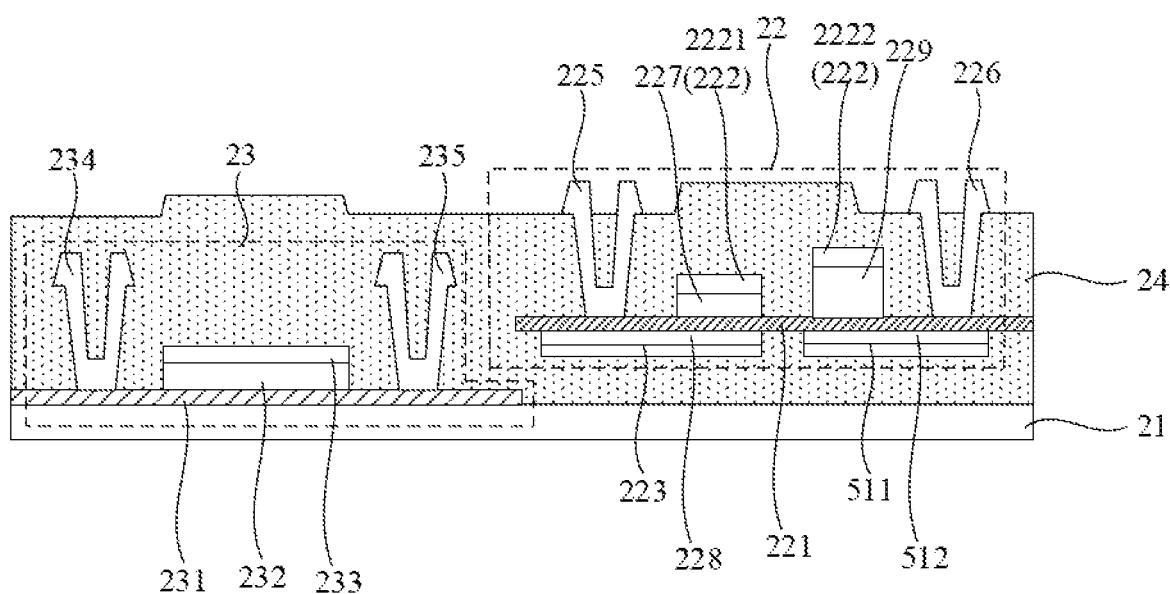
FIG. 7 is a schematic structural diagram of a drive backplane according to some embodiments of the present disclosure.

Some embodiments of the present disclosure provide a drive backplane. FIG. 7 is a schematic structural diagram of a drive backplane according to some embodiments of the present disclosure. As shown in FIG. 7, these embodiments differ from the embodiments shown in FIG. 5 in that the charge shielding layer 511 and the gate electrode 223 are located in the same plane, that is to say, the distance between the charge shielding layer 511 and the oxide active layer 221 is substantially the same as that between the gate electrode 223 and the oxide active layer 221. In some embodiments, the charge shielding layer 511 and the gate electrode 223 may be formed of the same material by using the same patterning process. As shown in FIG. 7, an insulating layer 512 is further provided between the charge shielding layer 511 and the oxide active layer 221. The orthographic projection of the first gate electrode 2221 on the substrate 21 falls within that of the gate electrode 223 on the substrate 21. The orthographic projection of the second gate electrode 2222 on the substrate 21 falls within that of the charge shielding layer 511 on the substrate 21. The orthographic projection of the gate electrode 223 on the substrate 21 does not overlap that of the charge shielding layer 511 on the substrate 21.

When the oxide thin film transistor 22 is in operation, a small positive voltage may be supplied to the charge shielding layer 511, so that the charge shielding layer 511 may attract movable negative charges (such as deep-level O (oxygen)) in the back channel of the oxide active layer 221 and the inorganic film layer close to the substrate. In this way, under the shielding effect of the charge shielding layer 511, the stability of the oxide thin film transistor can be significantly improved. The small positive voltage supplied to the charge shielding layer 511 is significantly smaller than the gate voltage supplied to any one of the plurality of gate electrodes. The small positive voltage may be close to 0V, for example, 0.1~0.5V.

In some embodiments, the second gate electrode 2222 shown in FIG. 7 can also be used as the charge shielding layer, which is not supplied with the gate voltage but with a shielding voltage. At this time, it can be called a charge shielding layer 2222. In this case, the charge shielding layer 2222 is supplied with a small negative voltage, so that the charge shielding layer 2222 can attract movable positive charges (such as shallow-level H (hydrogen)) above the first gate electrode 2221 and in the source electrode 225 and drain electrode 226, which avoids the threshold shift of the oxide thin film transistor 22 caused by the movements of the movable positive charges to the oxide active layer 221. In this way, under the shielding effect of the charge shielding layer, the stability of the oxide thin film transistor can be significantly improved. The small negative voltage supplied to the charge shielding layer 2222 is significantly smaller than the gate voltage supplied to any one of the plurality of gate electrodes. The small negative voltage may be close to 0V, for example, −0.1~−0.5V.

In some embodiments, the charge shielding layer 511 can be made of an opaque metal material. In this case, the charge shielding layer 511 can be used as a light blocking layer to prevent external light from damaging the stability of the oxide active layer, which can improve the stability of the oxide thin film transistor. In some embodiments, the second gate electrode 2222 can also be made of an opaque metal material. In this case, the second gate electrode 2222 can also be used as a light blocking layer to prevent external light from damaging the stability of the oxide active layer, which can improve the stability of the oxide thin film transistor.

When the charge shielding layer 511 and/or the second gate electrode 2222 are used as a light blocking layer, they may not be supplied with a voltage signal.

Figure 8:
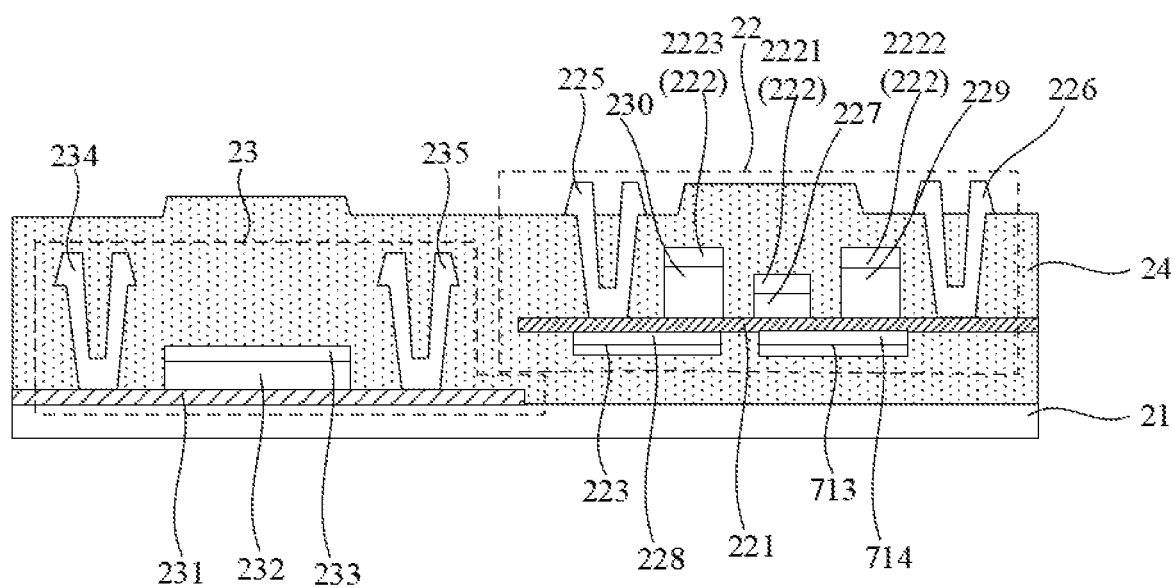
FIG. 8 is a schematic structural diagram of a drive backplane according to some embodiments of the present disclosure.

Some embodiments of the present disclosure provide a drive backplane. FIG. 8 is a schematic structural diagram of a drive backplane according to some embodiments of the present disclosure. As shown in FIG. 8, these embodiments differ from the embodiments shown in FIG. 6 in that the charge shielding layer 511 and the gate electrode 223 are located in the same plane, that is to say, the distance between the charge shielding layer 511 and the oxide active layer 221 is substantially the same as that between the gate electrode 223 and the oxide active layer 221. In some embodiments, the charge shielding layer 511 and the gate electrode 223 may be formed of the same material by using the same patterning process. As shown in FIG. 8, an insulating layer 512 is further provided between the charge shielding layer 511 and the oxide active layer 221. The orthographic projection of the fifth gate electrode 2223 on the substrate 21 falls within that of the gate electrode 223 on the substrate 21. The orthographic projections of the first gate electrode 2221 and the second gate electrode 2222 on the substrate 21 fall within the orthographic projection of the charge shielding layer 511 on the substrate 21. The orthographic projection of the gate electrode 223 on the substrate 21 does not overlap that of the charge shielding layer 511 on the substrate 21.

When the oxide thin film transistor 22 is in operation, a small positive voltage may be supplied to the charge shielding layer 511, so that the charge shielding layer 511 can attract movable negative charges (such as deep-level O (oxygen)) in the back channel of the oxide active layer 221 and the inorganic film layer close to the substrate. In this way, under the shielding effect of the charge shielding layer 511, the stability of the oxide thin film transistor can be significantly improved. The small positive voltage supplied to the charge shielding layer 511 is significantly smaller than the gate voltage supplied to any one of the plurality of gate electrodes. The small positive voltage may be close to 0V, for example, 0.1~0.5V.

In some embodiments, the charge shielding layer 511 can be made of an opaque metal material. In this case, the charge shielding layer 511 can be used as a light blocking layer to prevent external light from damaging the stability of the oxide active layer, which can improve the stability of the oxide thin film transistor. In some embodiments, the second gate electrode 2222 and the fifth gate electrode 2223 can also be made of an opaque metal material. In this case, the second gate electrode 2222 and the fifth gate electrode 2223 can also be used as light blocking layers to prevent external light from damaging the stability of the oxide active layer, which can improve the stability of the oxide thin film transistor.

When the charge shielding layer 511, the second gate electrode 2222 and/or the fifth gate electrode 2223 are used as light blocking layers, they may not be supplied with voltage signals.

Some embodiments of the present disclosure also provide a display panel including the drive backplane described in any of the above embodiments.

Some embodiments of the present disclosure also provide a display device further including the display panel described in any of the above embodiments.

It should be noted that the display device in these embodiments may be any product or component with a display function, such as electronic paper, mobile phone, tablet computer, television, notebook computer, digital photo frame, navigator, and the like.

It should be noted that in the drawings, the sizes of layers and regions may be exaggerated for clarity of illustration. It will also be understood that when an element or layer is referred to as being "on" another element or layer, it can be directly on the other element or there may be intervening layers. In addition, it is understood that when an element or layer is referred to as being "under" another element or layer, it can be directly under the other element, or there may be more than one intervening layers or elements. In addition, it is also understood that when a layer or element is referred to as being "between" two layers or two elements, it can be the only layer between the two layers or two elements, or there may be further more than one intervening layers or elements. Similar reference numerals indicate similar elements throughout.

In the present disclosure, the terms "first" and "second" are used for descriptive purposes and cannot be understood as indicating or implying relative importance. The term "a plurality of" refers to two or more, unless specifically defined otherwise.

After considering the disclosure in the description and embodiments, those skilled in the art will easily conceive of other embodiments of the present disclosure. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are to be regarded as exemplary only, and the true scope and spirit of the present disclosure are pointed out by the appended claims.

It should be understood that the present disclosure is not limited to the precise structure that has been described above and shown in the drawings, and various modifications and changes can be made without departing from its scope. The scope of the present disclosure is limited only by the appended claims.

What is claimed is:

1. A drive backplane, comprising:
   a substrate; and
   an oxide thin film transistor arranged on the substrate,
   wherein the oxide thin film transistor comprises:
      an oxide active layer;
      a first gate structure disposed on a side of the oxide active layer away from the substrate; and
      a second gate structure disposed between the oxide active layer and the substrate;
   wherein at least one of the first gate structure and the second gate structure comprises a plurality of gate electrodes spaced apart along a direction in which the oxide active layer extends,
   wherein the oxide thin film transistor further comprises a charge shielding layer disposed between the oxide active layer and the substrate, and a distance between the charge shielding layer and the oxide active layer is equal to a distance between the second gate structure and the oxide active layer, and wherein the charge shielding layer and the second gate structure are located in a same layer, and an orthographic projection of the charge shielding layer on the substrate does not overlap an orthographic projection of the second gate structure on the substrate.

2. The drive backplane according to claim 1, wherein a gate voltage supplied to each of the plurality of gate electrodes is adjustable.

3. The drive backplane according to claim 1, wherein gate voltages supplied to the plurality of gate electrodes are a same or different from each other.

4. The drive backplane according to claim 1, wherein for any one of the first gate structure and the second gate structure, a distance between two adjacent gate electrodes along the direction in which the oxide active layer extends is less than or equal to 2 μm.

5. The drive backplane according to claim 1, wherein the first gate structure comprises a first gate electrode and a second gate electrode, and orthographic projections of the first gate electrode and the second gate electrode on the substrate fall within an orthographic projection of the second gate structure on the substrate.

6. The drive backplane according to claim 1, wherein the second gate structure comprises a third gate electrode and a fourth gate electrode, and orthographic projections of the third gate electrode and the fourth gate electrode on the substrate fall within an orthographic projection of the first gate structure on the substrate.

7. The drive backplane according to claim 1, wherein the first gate structure comprises a first gate electrode and a second gate electrode, the second gate structure comprises a third gate electrode and a fourth gate electrode, an orthographic projection of the first gate electrode on the substrate at least partially overlaps an orthographic projection of the third gate electrode on the substrate, and an orthographic projection of the second gate electrode on the substrate at least partially overlaps an orthographic projection of the fourth gate electrode on the substrate.

8. The drive backplane according to claim 1, wherein the charge shielding layer is supplied with a first voltage, and the first voltage is less than a gate voltage supplied to each of the plurality of gate electrodes.

9. A display panel, comprising the drive backplane according to claim 1.

10. The drive backplane according to claim 1, wherein for any one of the first gate structure and the second gate structure, distances between the plurality of gate electrodes and the oxide active layer are a same.

11. The drive backplane according to claim 1, wherein for any one of the first gate structure and the second gate structure, distances between at least two gate electrodes of the plurality of gate electrodes and the oxide active layer are different.

12. The drive backplane according to claim 1, further comprising:
a low temperature poly-silicon thin film transistor arranged on the substrate,
wherein the low temperature poly-silicon thin film transistor comprises:
a poly-silicon active layer; and
a third gate structure disposed on a side of the poly-silicon active layer away from the substrate.

13. The drive backplane according to claim 12, wherein the third gate structure and the second gate structure are located in a same layer.

14. The drive backplane according to claim 1, wherein the oxide thin film transistor further comprises a light blocking layer disposed between the oxide active layer and the substrate, and a distance between the light blocking layer and the oxide active layer is greater than or equal to a distance between the second gate structure and the oxide active layer.

15. The drive backplane according to claim 14, wherein the light blocking layer is disposed between the second gate structure and the substrate, and an orthographic projection of the light blocking layer on the substrate at least partially overlaps an orthographic projection of the second gate structure on the substrate.

16. The drive backplane according to claim 14, wherein the light blocking layer and the second gate structure are located in a same layer, and an orthographic projection of the light blocking layer on the substrate does not overlap an orthographic projection of the second gate structure on the substrate.

* * * * *